US 6,660,343 B2
Dec. 9, 2003

(54) FABRICATION OF CONDUCTIVE/NON-CONDUCTIVE NANOCOMPOSITES BY LASER EVAPORATION

(75) Inventors: R. Andrew McGill, Lorton, VA (US); Douglas B. Chrisey, Bowie, MD (US); Alberto Pique, Bowie, MD (US)

(73) Assignee: The United States of America as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 09/966,772

(22) Filed: Oct. 1, 2001

(65) Prior Publication Data

US 2002/0081397 A1 Jun. 27, 2002

Related U.S. Application Data

(62) Division of application No. 09/492,071, filed on Jan. 27, 2000, now abandoned.
(60) Provisional application No. 60/117,467, filed on Jan. 27, 1999.

(51) Int. Cl.[7] .......................... C23C 14/04; C23C 14/06; C23C 14/28; B23K 13/00
(52) U.S. Cl. ........................ 427/597; 427/596; 427/196; 427/255.6; 427/255.7; 427/256; 427/282; 118/620; 118/727; 219/121.85
(58) Field of Search ............................... 427/566, 596, 427/597, 248.1, 282, 255.6, 562, 586, 196, 255.7, 256; 118/72 D, 723 VE, 62 D, 726, 727; 219/121.85

(56) References Cited

U.S. PATENT DOCUMENTS

| | | | | |
|---|---|---|---|---|
| 4,048,349 A | * | 9/1977 | White et al. ................. | 427/101 |
| 4,629,859 A | * | 12/1986 | Reddy .................... | 219/121.85 |
| 4,801,481 A | * | 1/1989 | Sagoi et al. ............. | 204/192.2 |
| 4,970,196 A | * | 11/1990 | Kim et al. ................... | 427/422 |
| 5,135,870 A | * | 8/1992 | Williams et al. ............. | 436/173 |
| 5,188,866 A | * | 2/1993 | Yamamoto et al. ......... | 427/132 |
| 5,192,580 A | * | 3/1993 | Blanchet-Fincher ...... | 427/255.6 |
| 5,242,706 A | | 9/1993 | Cotell et al. | |
| 5,288,528 A | * | 2/1994 | Blanchet-Fincher ...... | 427/255.6 |
| 5,292,559 A | * | 3/1994 | Joyce et al. ............. | 156/272.8 |
| 5,411,772 A | * | 5/1995 | Cheung ....................... | 427/561 |
| 5,490,912 A | * | 2/1996 | Warner et al. .............. | 118/620 |
| 5,672,297 A | | 9/1997 | Soane | |
| 5,820,948 A | * | 10/1998 | Itozaki et al. .......... | 219/121.76 |
| 6,025,036 A | * | 2/2000 | McGill et al. .............. | 427/492 |
| 6,200,444 B1 | | 3/2001 | Ahlers et al. | |

FOREIGN PATENT DOCUMENTS

WO    WO 97/37215    10/1997

OTHER PUBLICATIONS

Chrisey, D.B. and Hubler, G.K. Pulsed Laser Deposition of Thin Films, John Wiley & Sons, New York, 1994, pp. 567–579.*

McGill, Pique, Chrisey, Fitzgerald, Nguyen, Chung, Laser Processing of Polymers and Conductive Materials for the Fabrication of Conductive Composite Coatings: Applications with Chemical Sensors, 6th Annual International Conference on Composites Engineering, Jun. 27–Jul. 3, 1999, p563–564.

* cited by examiner

Primary Examiner—Shrive P. Beck
Assistant Examiner—Wesley Markham
(74) Attorney, Agent, or Firm—John J. Karasek; Rebecca L. Forman

(57) ABSTRACT

A composite layer of a sorbent, chemoselective, non-electrically-conducting polymer and nano-particles of an electrically conducting material dispersed throughout the polymer is formed on a substrate by pulsed laser deposition, matrix assisted pulsed laser evaporation or matrix assisted pulsed laser evaporation direct writing.

9 Claims, 4 Drawing Sheets

FABRICATION OF CONDUCTIVE/NON-CONDUCTIVE NANOCOMPOSITES BY LASER EVAPORATION

This is a divisional application of co-pending Application Ser. No. 09/492,071, filed Jan. 27, 2000, now abandoned, which claims priority from U.S. Provisional Application No. 60/117,467, filed Jan. 27, 1999. Application Ser. No. 09/492,071 is hereby incorporated herein by reference.

BACKGROUND OF THE INVENTION

1. Field of the Invention

The invention relates generally to the deposition of materials and more specifically to the creation by laser deposition of composite layers of non-electrically-conducting polymers and electrically conducting particles.

2. Description of the Related Art

A chemiresistor is a chemical sensor made of a material that has an electrical resistance that varies in response to the presence or absence of an analyte. Typically, a chemiresistor comprises a composite coating of a non-conducting material (such as a chemoselective polymer) and a conducting material (such as carbon or metallic nanoparticles). The conducting material is dispersed throughout the non-conducting material with a sufficient density so that in the absence of an analyte, the chemiresistor conducts electricity. When the chemiresistor is exposed to an analyte, the analyte is absorbed by the non-conducting material, causing the composite coating to swell and causing the conducting particles to move farther apart from each other, thereby creating a measurable increase in electrical resistance through the coating.

Previously, chemiresistors have been made using conventional coating deposition techniques, such as spin coating, drop casting, or spray coating. These are "wet" techniques, meaning that they are processes that involve wetting a substrate surface with a mixture of the composite coating material and a solvent that volatilizes only after the deposit has been formed. For reasons discussed below, each of these techniques has the disadvantage that after the solvent evaporates, the resulting coatings tend to be non-uniform, lacking in homogeneity and imprecisely located. All of these factors are critical for the optimum performance of the chemiresistor.

With spin coating and aerosol spray coating, relatively large surface areas can be coated. However, it is difficult to achieve precise or accurate control of coating thickness with high reproducibility because of the difficulty in duplicating variables such as the cleanliness of the substrate, the viscosity of the solution, temperature conditions, the spin rate of the substrate and the delivery rate of the solution. Moreover, spin coating and aerosol spray coating are not well suited for coating discrete, micron-sized substrate areas because of the difficulty of using masking with these techniques.

Drop casting, which involves delivering a material to a substrate through a syringe using an X-Y controlled stage or X-Y controlled syringe, allows for the coating of the discrete, micron-sized substrate areas through the precise placement of single droplets of the solution on the substrate. However, this technique provides inadequate control over the physical parameters of the deposit. Once a drop lands on the substrate surface, the final resting place of the polymer-conductor material depends on the wetting of the solvent to the surface, surface tension of the solution, how clean the surface is, the viscosity of the solution, both at the start and at all stages as the solvent evaporates, the evaporation rate of the solvent, the temperature of both the solution droplet and the substrate, the vapor pressure of the solvent, and the colligative properties of the dissolved materials that lower the vapor pressure of the solvent. Because the placement of matrix material is controlled by the movement and evaporation of solvent molecules on the substrate surface, there is little control over the shape of the resulting polymer-conductor film. Most deposits made using the drop casting technique are rounded in shape when viewed from directly above. This results from the initial spherical shape of the droplet that is deposited on the surface. There are many other shapes possible that depend heavily on the degree of surface contamination. Substrate surface areas that are relatively clean and are significantly wettable by the solvent solution (as indicated by small contact angle) result in significant spreading of the solution, and hence, a spreading of the polymer-conductor material. In contrast, substrate areas that are contaminated and are not significantly wettable by the solvent solution (as indicated by large contact angle) result in a more localized concentration of the solution and thicker films of polymer-conductor material.

An additional disadvantage of the three "wet" techniques described above is that as the solvent evaporates from a deposit, an increasingly concentrated solution of the composite material is formed, which may result in some degree of phase separation of the conducting and non-conducting material through aggregate formation. As a result, the conductive material would not be uniformly distributed through the polymeric film when all the solvent evaporated. Areas of the polymer coating may not have the required quantity or uniform distribution of conductive material to allow electrical conductance. The resulting performance of a sensor fabricated in this fashion would be significantly impaired. If, in order to compensate for this deficiency, an increased loading of conductive material is used, the physico-chemical properties of the coating could be altered. For example, if a carbonaceous material is used as the conductive material, increasing the carbon loading causes the solubility properties of the coating to increasingly reflect the non-polar adsorptive properties of the carbon (see, for example, "Integrated Chemiresistor and Work Function Microsensor Array with Carbon Black/Polymer Composite Materials", K. Domansky, V. S. Zapf, J. Grate, A. J. Ricco, W. G. Yelton, and J. Janata, Proc. Solid-State Sensor and Actuator Workshop, Hilton Head Islan, S.C., Jun. 8–11, 1998, pp 187–190, incorporated herein by reference.) An increase in non-polar adsorptive properties is undesirable if the polymer properties have been tailored towards sorbing polar analytes.

SUMMARY OF THE INVENTION

Accordingly, it is an object of the present invention to provide a coating of a composite material of a non-electrically-conductive polymer and electrically conducting particles wherein the electrically conducting particles are dispersed homogeneously throughout the non-electrically-conductive polymer.

It is a further object of the present invention to provide a method of making a composite coating of a non-electrically-conductive polymer and electrically conducting particles wherein the thickness, uniformity, homogeneity, location and surface coverage of the coating are precisely controlled.

These and other objects of the invention are achieved by a method of forming a layer of a composite material of a non-electrically-conductive polymer and electrically conducting particles wherein the layer is formed by laser deposition. The creation of the layer can be done either by pulsed laser deposition, matrix assisted pulsed laser evaporation (MAPLE) or a direct write form of matrix assisted pulsed laser evaporation (MAPLE-DW).

BRIEF DESCRIPTION OF THE DRAWINGS

A more complete appreciation of the invention will be readily obtained by reference to the following Detailed Description of the Preferred Embodiments and the accompanying drawings.

DETAILED DESCRIPTION OF THE PREFERRED EMBODIMENTS

The present invention relates to composite films or layers made up of non-electrically conducting polymers, such as chemoselective polymers, and electrically-conducting particles, the layers having physical properties of uniform thickness, homogeneity and precise placement that can only be achieved through methods of laser deposition. The methods of laser deposition that may be used in the present invention include pulsed laser deposition (PLD), matrix assisted pulsed laser evaporation (MAPLE) or a direct write form of matrix assisted pulsed laser evaporation (MAPLE-DW).

The non-electrically conducting polymer is preferably a sorbent chemoselective polymer, that is, a polymer such as polyepichlorohydrin (PECH) that is chosen for its ability to interact selectively with a particular chemical or biological analyte or with a particular class or type of chemical or biological analytes. Criteria for selecting non-electrically-conducting materials for chemical sensing devices are described in detail in McGill et al, "Choosing Polymer Coatings for Chemical Sensors", CHEMTECH, Vol. 24, No. 9, pp 27–39 (1994) and in U.S. patent application Ser. No. 08/864,320, filed May 28, 1997 by McGill et al for "Method of Producing a Film Coating by Matrix Assisted Laser Evaporation," the disclosures of which are incorporated herein by reference. Other examples of chemoselective materials include SXFA (poly(oxy{methyl[4-hydroxy-4,4, bis(trifluoromethyl)but-1-en-1-yl]silylene})) and P4V (poly (4-vinylhexfluorocumyl alcohol)), perfluoro-polyethers terminated with a variety of functional groups such as $CF_3CH_2OH$, polyethylene imines, polysiloxanes, alkylamino pyridyl substituted polysiloxanes, polytetrafluoroethylene, polysilanes, polyesters, polyvinylaldehydes, polyisobutylene, polyvinylesters, polyalkenes, zeolites, aerogels, porous carbon, metals, silicalites, clay materials, cellulose materials, polyanilines, polythiophenes, polypyrroles, fullerenes, cyclodextrins, cyclophanes, calixeranes, crown ethers, and organic dyes. Examples of biochemical selective materials include antibodies, antigens, DNA, RNA, proteins, oligopeptides, polypeptides, oligosaccharides, polysaccharides, and lipids.

The electrically conducting particles are preferably made of carbonaceous material (such as, for example, graphite particles or carbon nanotubes) or metallic material (such as, for example, gold). Preferably, the particles are nano-particles, that is, typically, particles in the size range of 10 nm to 1000 nm.

The non-electrically-conducting polymer and the electrically conducting particles are combined to form a target for laser deposition, according to the particular deposition method being used, as described below. Typically, the loading of the electrically conducting particles in the non-electrically-conducting polymer is about 20% (w/w).

Pulsed Laser Deposition

Figure 1:
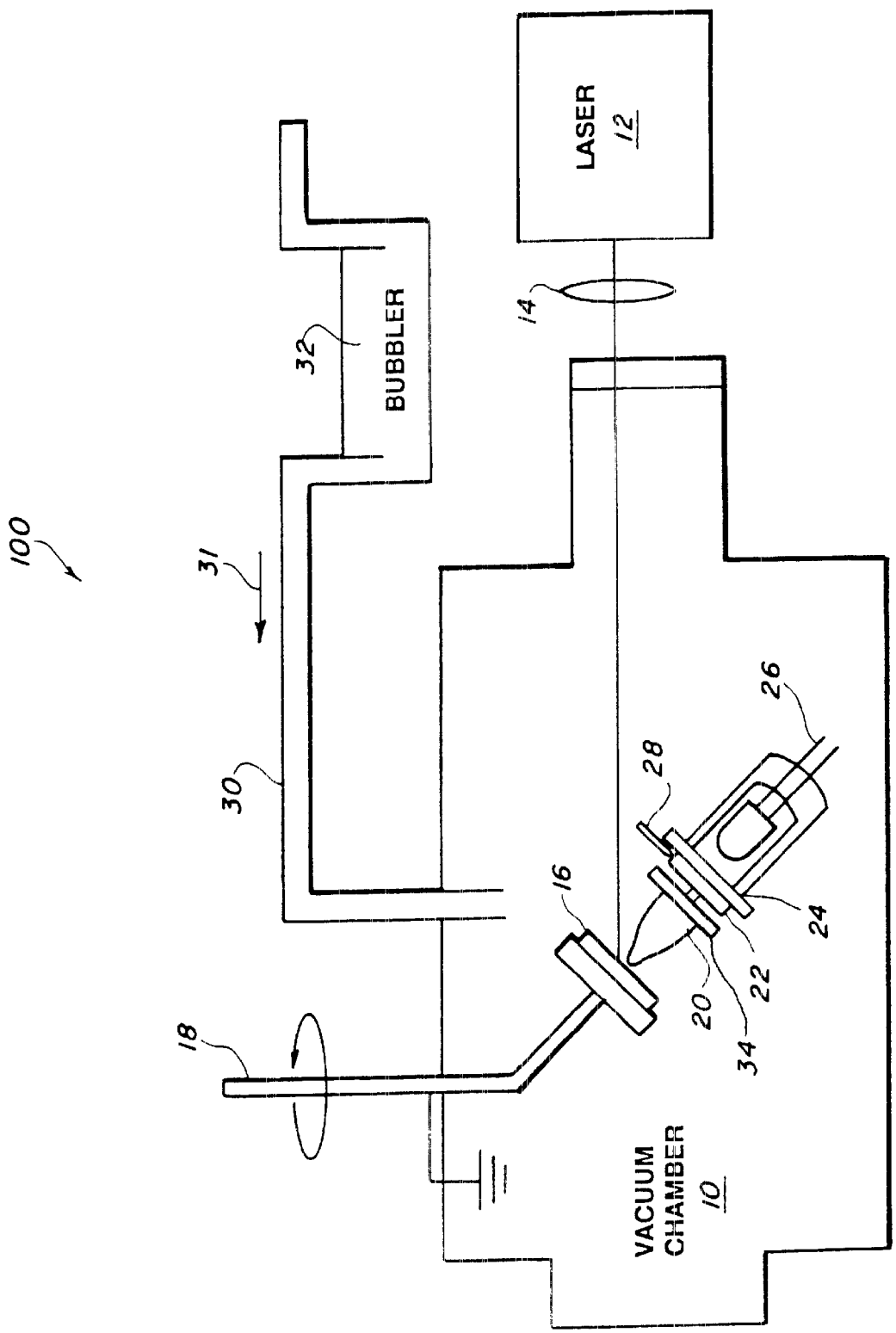
FIG. 1 is a schematic representation of the method for creating a composite layer by pulsed layer deposition.

The technique of pulsed laser deposition or pulsed laser evaporation is described generally in Pulsed Laser Deposition of Thin Films, Chrisey, D. B.; and Hubler, G. K., Eds., John Wiley & Sons, New York, 1994, incorporated herein by reference. For the present invention, the laser target is formed by co-dissolving the non-electrically-conducting polymer and the electrically-conducting particles in a solvent, and then subsequently removing the solvent. The target is placed inside a deposition chamber, and the receiving substrate is placed in front of the target at a distance of between 2–10 cm. (To create a deposit that is limited to a select area, a mask may be placed in front of the receiving substrate.) As shown in FIG. 1, a typical apparatus 100 useful for carrying out the method of the present invention includes a vacuum chamber 10 and a laser 12 (preferably a pulsed laser, such as, for example, KrF excimer, 248 nm; or ArF, 193 nm) that is focused through a lens 14 onto a target 16, which is made of a mixture of the non-electrically-conducting polymer and the electrically-conducting particles. The target 16 is affixed to a rotating arm 18 that allows a plume 20 to be precessed over a substrate 22, thus covering a wider area than a fixed arm geometry would allow. A substrate holder 24 is electrically isolated and may be heated by means of a quartz lamp 26. The temperature is monitored by a thermocouple 28. A gas inlet port 30 allows the introduction of gases into the chamber 10 in the direction of arrow 31. A bubbler 32 (optional) may be used when a water vapor environment is desired. The chamber is operated at a reduced pressure in the presence of an inert gas such as nitrogen or argon at 50 millitorr. The target material is exposed to the laser 12, which results in the transfer and co-deposition of the non-electrically-conducting polymer and the electrically-conducting particles to the receiving substrate. A mask 34 may be interposed between the target and the receiving substrate so that a patterned deposit is created.

Figure 2:
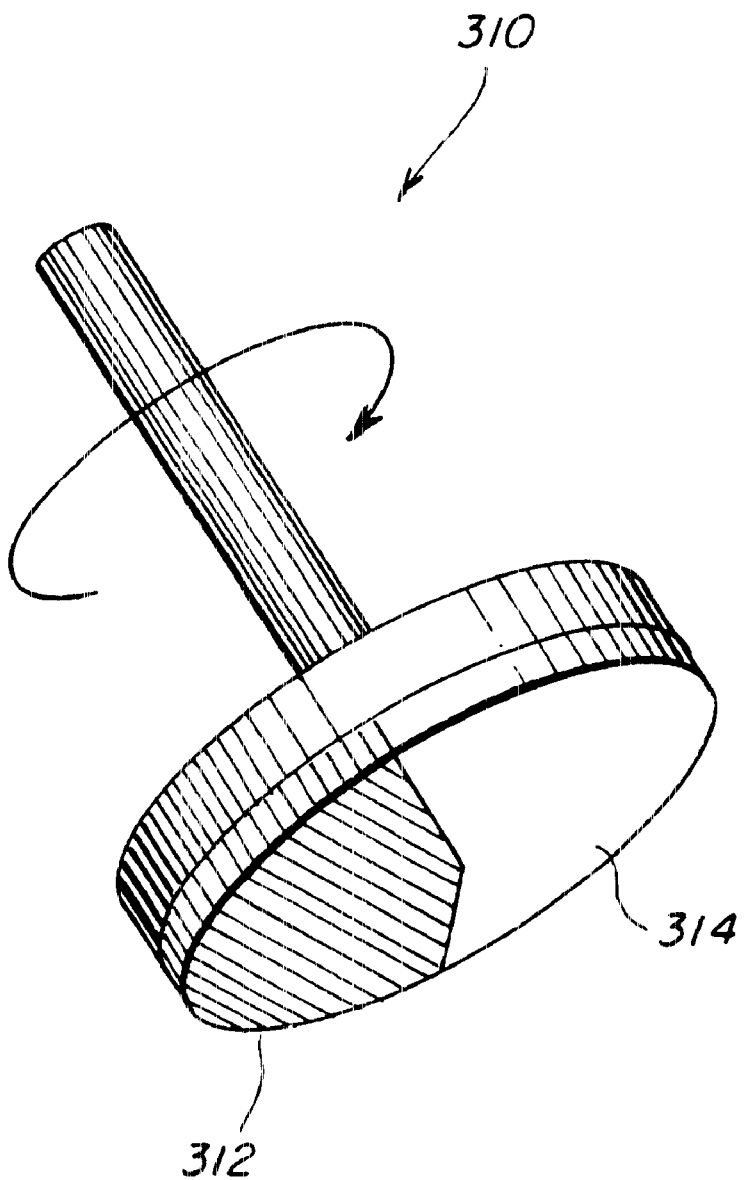
FIG. 2 is a schematic representation of a segmented target.

In an alternative method of pulsed laser deposition, the target can be made up of discrete segments, one segment containing the non-electrically-conducting polymer and the other segment containing the electrically-conducting particles. When the target is rotated, each segment is alternately exposed to the laser, and alternating plumes of non-electrically-conducting polymer and electrically-conducting particles are created and the non-electrically-conducting polymer and the electrically conducting particles are alternately deposited on the substrate. If the target is rotated quickly, a single-layer composite of the non-electrically-conducting polymer and the electrically the electrically conducting particles is created. If the target is rotated slowly, a multilayer composite having separate layers of the non-electrically-conducting polymer and the electrically conducting particles is created. The segmented target is shown schematically in FIG. 2, wherein a rotating target, 310, includes a segment 312 having a non-conducting polymer and a segment 314 having electrically conducting particles.

Figure 3:
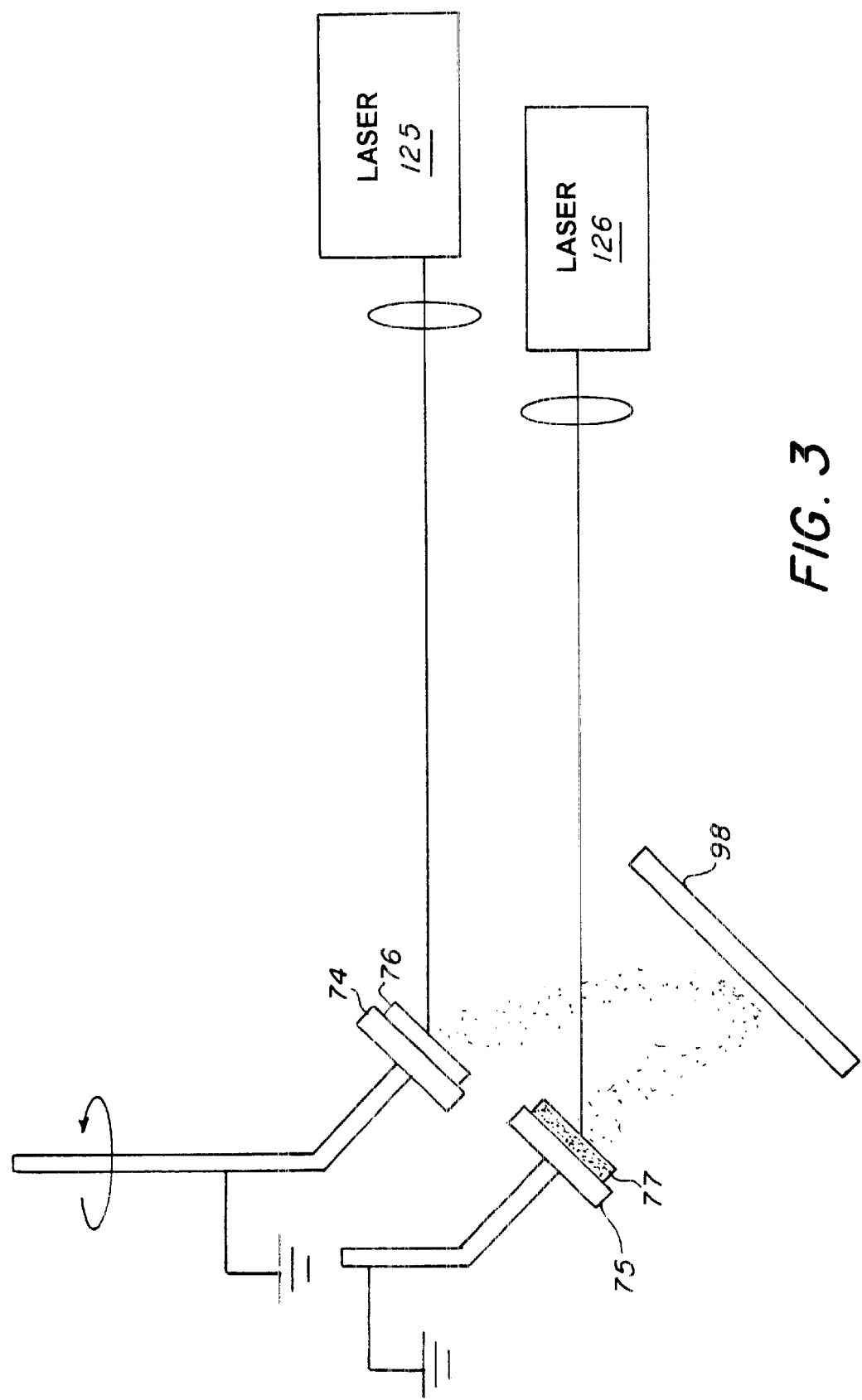
FIG. 3 is a schematic representation of the method for creating a composite layer by pulsed laser deposition, using a separate target for the polymer and the conducting particles.

In another alternative, two targets, one with the non-electrically-conducting polymer and one with the electrically conducting material, may be used in the same vacuum chamber and irradiated, either simultaneously, to form a single-layer composite of the particles of the electrically conducting material dispersed throughout the non-electrically-conducting polymer, or alternatively, to form a multilayer composite having alternating layers of the particles of electrically conducting material and the non-electrically conducting polymer. This embodiment is shown in FIG. 3, wherein lasers 125 and 126 are directed to strike target 74 having a non-electrically-conducting polymer 76 and target 75 having electrically conducting particles 77 (or a material that forms electrically conducting particles). By the action of the two lasers, the non-electrically-conducting polymer and the electrically conducting particles are ablated from their respective targets to form a composite on substrate 98.

Matrix Assisted Pulsed Laser Evaporation

The technique of matrix assisted pulsed laser evaporation is described generally in following publications and patent applications, incorporated herein by reference: "Matrix assisted pulsed laser evaporation (MAPLE) of functionalized polymers: Applications with chemical sensors", Proc. SPIE Laser Applications in Microelectronic and Optoelectronic Manufacturing III, R. Andrew McGill, Douglas B. Chrisey, Alberto Pique, Todd E. Mlsna, San Jose, Calif., 1998, pp. 255–266; "Performance Optimization of Surface Acoustic Wave Chemical Sensors", R. Andrew McGill, Russell Chung, Douglas B. Chrisey, Paul C. Dorsey, Paul Matthews, Alberto Pique, Todd E. Mlsna, and Jennifer L. Stepnowski, IEEE Trans. on UFFC, 1998, 45(5), 1370–1380, U.S. patent application Ser. No. 08/864,320, filed May 28, 1997 by McGill et al for "Method of Producing a Film Coating by Matrix Assisted Laser Evaporation"; and "Use of Matrix Assisted Pulsed Laser Evaporation (MAPLE) For The Growth of Organic Thin Films", A. Pique, D. B. Chrisey, B. J. Spargo, M. A. Bucaro, R. W. Vachet, J. H. Callahan, R. A. McGill, D. Leonhardt, and T. E. Mlsna, Proc Mat. Res. Soc. Proc. Vol. 526, 1998, 421–426. The apparatus for carrying the present invention may be the same as that used for pulsed laser deposition, except that in this embodiment, the target is a matrix of the non-electrically-conducting polymer and the electrically conducting particles co-dissolved or suspended in a binder, which may be frozen. In certain embodiments, the binder may be selected from the group consisting of addition polymers, condensation polymers, water, aromatic compounds, alcohols, ketones, aldehydes, esters, alkanes, thiols, phenols, carboxylic acids, amines, and heterocyclic organic compounds. The freezing process can be simply achieved by immersion in liquid nitrogen or cooling the container that contains the matrix solution. Additionally, for the polymer-solvent matrices, the solvent can be prepared as a viscous solution or solvent swollen polymer target. In these latter matrices, the target does not require freezing, even if the solvent is a liquid under the operated chamber conditions. The target is placed inside a chamber, together with a substrate to be coated placed in front of the targets at a distance of between 1–10 cm, with or without a mask placed in front of the substrate to be coated. The mask can be contacting or non contacting the substrate to be coated. If a non contacting mask is used, a substrate-mask separation distance of about 1 micron is optimum. The chamber is operated at a reduced pressure in the presence of an "inert" gas such as nitrogen or argon at @ 50 millitorr. The target material is exposed to a pulsed laser (e.g. KrF excimer, 248 nm; or ArF, 193 nm) which results in the transfer and co-deposition of the polymer and conductive materials. The target is continuously rotated while the deposition process is in progress. To further optimize the coating uniformity the substrate can be heated either from a radiant heat lamp or by electrically heating the substrate to above the melting point or glass transition temperature of the polymer.

EXAMPLE

For demonstration purposes, a glass substrate was prepared with 2 gold contact pads separated by 1 mm gap. The gold pads were 500×500 $\mu$m in area, with a thickness of 1 $\mu$m. The bare gap between the gold contact pads was masked so that deposition would occur to fill the space between the electrodes. The frozen target of PECH/carbon/CHCl$_3$ (composition 0.2 g carbon/gram of PECH) was exposed to a pulsed laser and the masked off area was coated with the evaporated material. A visible PECH/carbon film was produced. The film thickness was determined by profilometry at about 1 $\mu$m and a resistance of 100 K ohms was measured between the 2 contact pads. On exposure to vapor, the resistance of the device increased. The resistance recovered to its original signal level after removal of vapor. The PECH/Carbon films produced by the above method were very uniform. Comparative photomicrographs (at ×50 magnification) of PECH/carbon coatings made by the method described above and PECH/carbon coatings made by solvent drop casting show that the method of the present invention produces uniform coatings whereas the method of solvent drop casting does not produce uniform coatings.

As with pulsed laser deposition, it is possible to carry out the matrix-assisted pulsed laser evaporation with two separate targets, one with a mixture of the non-electrically-conducting polymer and a solvent, and one with a mixture of the electrically conductive particles and a solvent. Also, as discussed with respect to pulsed laser deposition, it is possible to carry out matrix-assisted pulsed laser evaporation with a segmented, rotating target.

Matrix Assisted Pulsed Laser Evaporation—Direct Write

The technique of matrix assisted pulsed laser evaporation-direct write is described generally in the following patent application and publication, both incorporated herein by reference: U.S. patent application Ser. No. 09/318,134, filed by the present inventors on May 25, 1999 for "MATRIX-ASSISTED PULSED LASER EVAPORATION DIRECT WRITE" and "Laser Direct Writing of Active and Passive Circuit Elements," A. Pique, D. B. Chrisey, R. Y. Auyeung, S. Lakeou, R. Chung, R. A. McGill, P. K. Wu, and W. Warren, in Proc. SPW Laser Applications in Microelectronic and Optoelectronic Manufacturing IV, San Jose, Calif., 1999, pp. In Press.

Figure 4:
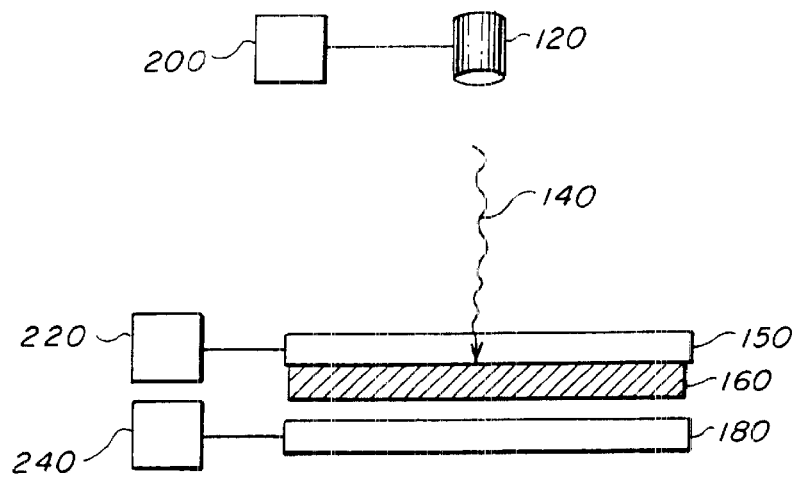
FIG. 4 is a schematic representation of the apparatus for creating a composite by matrix assisted pulsed laser evaporation direct write.
Figure 5A:
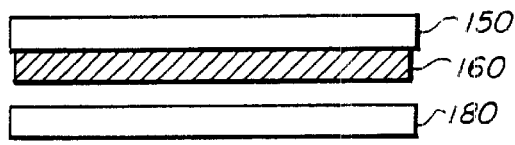
FIGS. 5a and 5b are shematic representations of the laser transparent substrate, the coating and the receiving substrate before (5a) and after (5b) depositing the non-electrically conducting polymers and electrically-conducting particles on the receiving substrate by matrix assisted pulsed laser evaporation direct write.
Figure 5B:
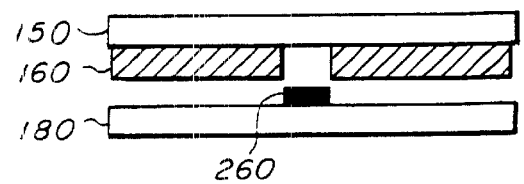

For this embodiment of the present invention, the polymer and the carbon or metal (e.g., carbon or gold nano-particles) are co-dissolved or a suspension is formed in a solvent and this coated onto a laser transparent support (typically called the "ribbon"). The laser transparent support is exposed to a focused pulsed laser(s) (e.g. KrF excimer, 248 nm; or ArF, 193 nm) at atmospheric pressure under ambient laboratory conditions. The laser is directed through the laser transparent support and strikes the matrix coating causing the coating to desorb. A substrate is positioned so that the desorbed material is transferred to the substrate. By moving the substrate and/or the laser, the composite material is transferred to the substrate and any surface structure can be written to the substrate with the aid of a computer assisted design program. The gap between the ribbon and the substrate can be varied from between about 1 $\mu$m (25 $\mu$m practical with current equipment) to 100 $\mu$m in order to control the size of the transferred spot, and the flux of material that strikes the substrate surface. The method is schematically represented in FIGS. 4, 5a and 5b. The apparatus for carrying out matrix-assisted pulsed laser evaporation direct write includes a pulsed laser 120 that emits pulsed laser energy as depicted by arrow 140. The pulsed laser is positioned so that laser pulses travel through the back surface of the target substrate and through the laser transparent support 150 to strike the coating 160, which comprises a mixture of the non-electrically-conducting polymer and electrically-conducting particles. The coating may also include a binder. The receiving substrate 180 is positioned so that when the coating desorbs from the target substrate, the non-electrically-conducting polymer and the electrically conducting particles are co-deposited on the receiving substrate. The laser 120, the target substrate and the receiving substrate 180 are connected to a laser positioning means 200, a target substrate positioning means 220, and a receiving substrate positioning means 240, respectively. FIGS. 5a and 5b schematically illustrate the effects of exposing the coating 160 to the pulsed laser energy 140, whereby the coating 160 desorbs from the surface of the target substrate so that a mixture of the non-electrically-conducting polymer and the electrically conducting particles 260 is deposited onto the receiving substrate 180.

EXAMPLE

For a polyepichlorohydrin and carbon matrix, a ribbon was prepared by spin coating a film of PECH/graphite on a quartz wafer, at a PECH/graphite thickness of @ 1 $\mu$m from a solution in chloroform. The ribbon was exposed to a pulsed laser that transferred the PECH/graphite matrix to a variety of substrates including glass, ceramics (e.g., alumina), plastics (e.g., polyimide), circuit board composites, silicon and metal surfaces. For demonstration purposes, a 500 nm×400 $\mu$m×250 $\mu$m bridge was fabricated over and between two gold electrodes. The gold electrodes had previously been deposited on a printed circuit board. Several test structures were prepared at different resistances. In general, on exposure to an uncalibrated acetone vapor source, the chemiresistors ohmic resistance increased by between 5 and 10% of the initial value 100 K ohm, and in less than 1 second. After removal of the acetone, the resistances returned to their original values in approximately the same time frame.

Obviously, many modifications and variations of the present invention are possible in light of the above teachings. It is therefore to be understood that, within the scope of the appended claims, the invention may be practiced otherwise than as specifically described.

What is claimed is:

1. A method of creating a composite material on a receiving substrate, the method comprising the steps of:
   (a) providing a source of laser energy;
   (b) providing a receiving substrate;
   (c) providing a rotatable target, the target comprising a first target segment including a chemoselective polymer and a second target segment including particles of a carbonaceous or metallic material; and
   (d) rotating the target while exposing the target to the source of laser energy so that the laser energy alternately strikes the first target segment and the second target segment, alternately causing the chemoselective polymer and the particles of a carbonaceous or metallic material to desorb and be lifted from the target and wherein the target and the receiving substrate are oriented with respect to each other such that the chemoselective polymer and the particles of a carbonaceous or metallic material are transferred onto the receiving substrate, thereby forming a composite material wherein the target is rotated at a speed sufficiently slow so that when the chemoselective polymer and the particles of a carbonaceous or metallic material are transferred onto the receiving substrate, they form alternating layers of the chemoselective polymer and the particles of carbonaceous or metallic material.

2. A method of creating a composite material on a receiving substrate, the method comprising the steps of:
   (a) providing a first source of laser energy and a second source of laser energy;
   (b) providing a receiving substrate;
   (c) providing a first target and a second target. the first target comprising a chemoselective polymer and the second target comprising particles of a carbonaceous or metallic material; and
   (d) exposing the first target to the first source of laser energy so that the laser energy strikes the first target and causes a portion of the chemoselective polymer to desorb and be lifted from the target; and
   (e) exposing the second target to the second source of laser energy so that the laser energy strikes the second target and causes a portion of the carbanceous or metallic material to separate from the second target in the form of particles;

wherein the first target, the second target and the receiving substrate are oriented with respect to each other so that the chemoselective polymer and the particles of a carbonaceous or metallic material are transferred onto the receiving substrate thereby forming a composite material; and wherein steps (d) and (e) are carried out alternatively so that alternating layers of chemoselective polymer and particles of the carbonaceous or metallic material are formed on the substrate.

3. A method of creating a layer of composite material on a receiving substrate, the method comprising the steps of
   (a) providing a source of laser energy
   (b) providing a receiving substrate
   (c) providing a target substrate, wherein the target substrate has a surface, the surface being provided with a coating, the coating comprising a chemoselective polymer, particles of a carbonaceous or metallic material and a matrix material, and
   (d) exposing the target substrate to the source of laser energy so that the laser energy strikes the coating and causes the coating to desorb and be lifted from the surface of the target substrate, whereby the matrix material volatilizes, and wherein the target substrate and the receiving substrate are oriented with respect to each other such that the carbonaceous or metallic material and the chemoselective polymer are transferred onto the receiving substrate to form a layer of composite material.

4. The method of claim 3 wherein a mask is interposed between the target and the receiving substrate so that the chemoselective polymer and particles of a carbonaceous or metallic material are transferred to only a preselected portion of the receiving substrate.

5. The method of claim 3 wherein the matrix material is selected from the group consisting of addition polymers, condensation polymers, water, aromatic compounds, alcohols, ketones, aldehydes, esters, alkanes, thiols, phenols, carboxylic acids, amines, and heterocyclic organic compounds.

6. A method of creating a composite material on a receiving substrate, the method comprising the steps of
   (a) providing a source of laser energy
   (b) providing a receiving substrate
   (c) providing a rotatable target, the target comprising a first target segment the first target segment comprising a chemoselective polymer and a first matrix material and a second target segment, the second target segment comprising particles of a carbonaceous or metallic material and a second matrix material,
   (d) rotating the target while exposing the target to the source of laser energy so that the laser energy alternately strikes the first target segment and the second target segment, alternately causing the chemoselective polymer/first matrix material or the particles of a carbonaceous or metallic material/second matrix material to desorb and be lifted from the target and wherein the target and the receiving substrate are oriented with respect to each other such that the chemoselective polymer and the particles of a carbonaceous or metallic material are transferred onto the receiving substrate, thereby forming a composite material.

7. A method of creating a composite material on a receiving substrate, the method comprising the steps of
   (a) providing a first source of laser energy and a second source of laser energy,
   (b) providing a receiving substrate
   (c) providing a first target and a second target, the first target comprising a chemoselective polymer and a first matrix material and the second target comprising particles of a carbonaceous or metallic material dispersed throughout a second matrix material,
   (d) exposing the first target to the first source of laser energy so that the laser energy strikes the first target and causes the chemoselective polymer and the first matrix material to desorb and be lifted from the target,
   (e) exposing the second target to the second source of laser energy so that the laser energy strikes the second target and causes the particles of a carbonaceous or metallic material dispersed throughout a second matrix material to desorb and be lifted from the target,
   wherein the first target, the second target and the receiving substrate are oriented with respect to each other so that the chemoselective polymer and particles of a carbonaceous or metallic material are transferred onto the receiving substrate thereby forming a composite material.

8. A method for creating a layer of composite material on a receiving substrate, the method comprising the steps of:
   (a) providing a source of laser energy;
   (b) providing a receiving substrate;
   (c) providing a target substrate comprising a laser-transparent support having a back surface and a front surface, wherein the front surface has a coating that comprises a chemoselective polymer, particles of a carbonaceous or metallic material and a binder;
   (d) positioning the source of laser energy in relation to the target substrate and exposing the target substrate to pulsed laser energy so that the pulsed laser energy is directed through the back surface of the target substrate and through the laser-transparent support to strike the coating at a defined location with sufficient energy to cause the coating to desorb from the location and be lifted from the surface of the target substrate, whereby the binder volatilizes; and
   (e) positioning the receiving substrate in a spaced relation to the target substrate so that the chemoselective polymer and particles of a carbonaceous or metallic material in the desorbed coating are transferred onto the receiving substrate to form a layer of composite material at a defined location on the receiving substrate.

9. The method of claim 8 wherein the binder material is selected from the group consisting of addition polymers, condensation polymers, water, aromatic compounds, alcohols, ketones, aldehydes, esters, alkanes, thiols, phenols, carboxylic acids, amines, and heterocyclic organic compounds.

* * * * *